United States Patent [19]

Cap et al.

[11] Patent Number: 4,992,688
[45] Date of Patent: Feb. 12, 1991

[54] PRINTED CIRCUIT BOARD WITH A METALLIC LAYER FOR SUPPORTING AN ELECTRICAL COMPONENT

[75] Inventors: Heinrich Cap, St. Georgen-Peterzell; Georg Moosman, Tennenbronn, both of Fed. Rep. of Germany

[73] Assignee: Papst-Motoren GmbH & Co. KG, St. Georgen, Fed. Rep. of Germany

[21] Appl. No.: 245,302

[22] Filed: Sep. 16, 1988

[30] Foreign Application Priority Data

Sep. 16, 1987 [DE] Fed. Rep. of Germany ....... 8712486

[51] Int. Cl.⁵ ............................................. H02K 29/08
[52] U.S. Cl. ........................................ 310/71; 361/401
[58] Field of Search ............ 310/40 MM, 67 R, 68 B, 310/71, 268, 89, DIG. 6; 361/401, 414, 424

[56] References Cited

U.S. PATENT DOCUMENTS

| | | | |
|---|---|---|---|
| 4,143,508 | 3/1979 | Ohno | 361/401 X |
| 4,392,181 | 7/1983 | Jabben | 361/401 |
| 4,549,104 | 10/1985 | Nimura et al. | 310/156 X |
| 4,682,414 | 7/1987 | Butt | 361/414 X |
| 4,724,346 | 2/1988 | Klein et al. | 310/71 X |
| 4,737,672 | 4/1988 | Kazami | 310/DIG. 6 X |
| 4,785,242 | 11/1988 | Vaidya et al. | 310/68 B X |
| 4,806,808 | 2/1989 | Grecksch et al. | 361/401 X |

FOREIGN PATENT DOCUMENTS 0220447 9/1986 European Pat. Off. .
2346380 11/1974 Fed. Rep. of Germany .

Primary Examiner—Steven L. Stephan
Assistant Examiner—Kristine Peckman
Attorney, Agent, or Firm—Barnes & Thornburg

[57] ABSTRACT

A composite printed circuit board having a metallic layer supporting body with a first insulating layer thereon and wherein the insulating layer has copper printed circuits placed thereon. The printed circuit board is adapted to precisely hold and position electric components (normally electrical motor sensors) on stamped out recesses in the composite body. The stamped out recesses have edge portions for finitely positioning the components and allow for electric leads coming from the components to pass over the bent tabular portion of the recess to be soldered to the copper circuits.

19 Claims, 3 Drawing Sheets

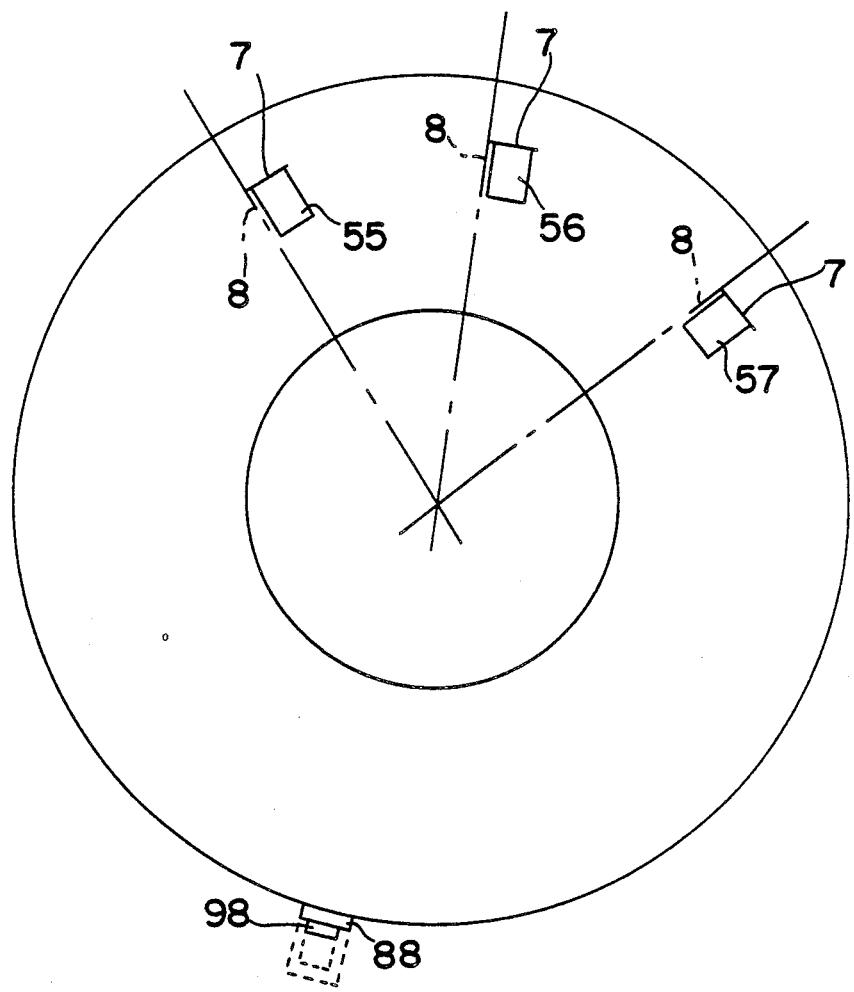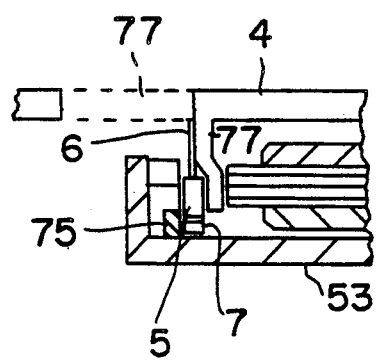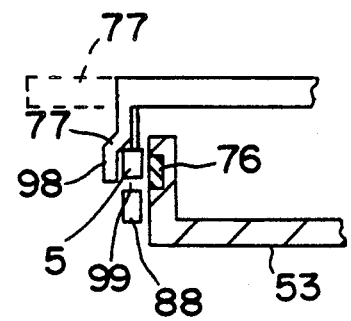

PRINTED CIRCUIT BOARD WITH A METALLIC LAYER FOR SUPPORTING AN ELECTRICAL COMPONENT

BACKGROUND AND SUMMARY OF THE INVENTION

The invention relates to an electrical component support on a printed circuit board with a metallic layer supporting body, on which a flat insulating layer is provided. The printed circuit board elements are provided on this insulating layer and the printed circuit board elements have individual metallic tracks for the connection of leads from the electric components.

Commonly printed circuit boards, particularly printed circuit boards having a metal layer (metal PCB's or Printed Circuit boards), have their electric components mounted by means of Surface-Mounted Device Technology (SMD). In this case, the electric components are directly glued onto the flat circuit board metallic layer without any insulating interlayer connection. The leads on both sides of the electrical component, along with the corresponding contact surfaces of the printed circuit board, are then moved through a soldering bath where the leads are connected with the printed circuits. In the case where several electrical components are utilized, the leads must be bent before the soldering process takes place. In every case of metal PCB's of this type, the overall heights of the components (such as transistors, Hall-IC's, etc.) have their full effect on the overall height of the device for which the circuit board is to be used on the side containing the component; for example, the overall height of an electric motor is increased by the height of the component(s).

In addition, it is quite expensive to precisely position the flat-placed electric components on the circuit board. In order to avoid a bending of the leads of the electric component, it is known to correspondingly punch holes into the metal PCB. The resulting punched edge is not desirable because the edge can permit damaging of the insulation of the leads which could actually short circuit a part or portion of the system. Additionally, the absence of the punched-out metal of the printed circuit boards due to the punched-out holes, results in a higher leakage flux, particularly for magnetically sensitive electrical components.

The invention is based on the object of providing a printed circuit board of the initially mentioned type which, without any special expenditures, allows for a precise mounting of the electrical component on the circuit board, which mounting is held constant and fixed for a long time, is resistant to changes in temperatures at the circuit board, and of the electric components. This is particularly true when the electrical components are sensors, such as rotor rotation detectors. Also of concern is the relative and exact positioning of a plurality of sensors to one another as well as to a motor rotor and to obtain this positioning at a cost-reducing mounting.

This object is achieved by utilizing a printed circuit board having a metallic layer supporting body on which a flat insulating layer is provided and with a layer having individual metallic tracks being provided on this insulating layer for the connection of electric components, and wherein there is at least one depression impressed into the printed circuit board for accommodating electric components.

In accordance with the invention and for a further reduction of the axial overall height of electric motors, impressions are made in the printed circuit board which open in the direction of the rotor flange and wherein the electric components are placed into these impressions. In addition, the impressions offer protection to the electric components, to the soldered ends of the power leads and to other components.

The precise fixing of a component is made possible by its resting against cut edges of the recess formed by the impression. The invention makes it possible to fit, for example, a Hall-IC into the impression of the low-retentivity printed circuit board in such a manner that an increased magnetic short-circuit for the Hall element (Hall generator or Hall IC) results in a larger signal deviation (output voltage). The insulation layer of the printed circuit board can shield against any undesirable leakage flux.

Other objects, advantages and novel features of the present invention will become apparent from the following detailed description of the invention when considered in conjunction with the accompanying drawings.

BRIEF DESCRIPTION OF THE DRAWINGS

FIG. 5 shows a modification of the location of the recess holding the sensor wherein the recess is in a tab bent downwardly inside the rotor of the motor of FIG. 4;

FIG. 6 shows a variant of FIG. 5 wherein the tab is bent down outside the rotor of the motor of FIG. 4; and FIG. 7 shows a schematic representation of placing three electronic components used for an electric motor on a printed circuit board.

DETAILED DESCRIPTION OF THE DRAWINGS

Figure 1:
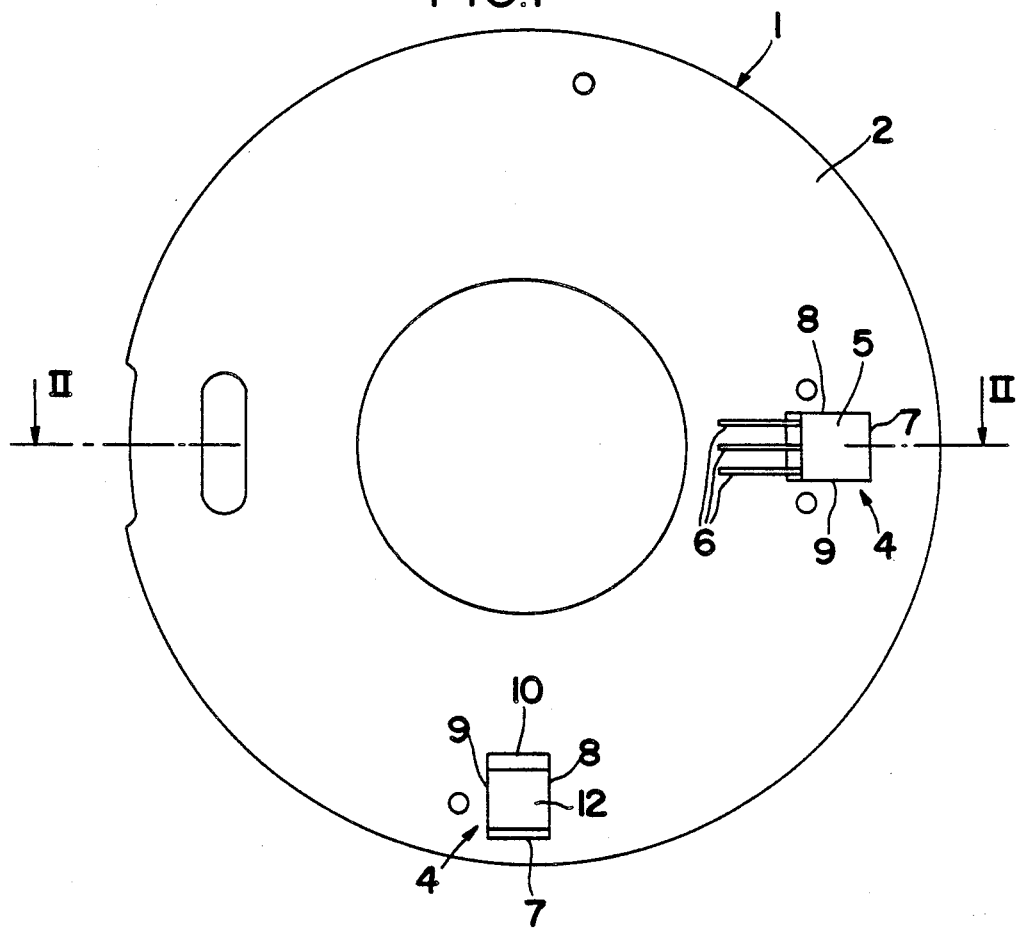
FIG. 1 is a plan view of a printed circuit board according to the invention in the direction facing the depressions according to Arrow A in FIG. 2.
Figure 2:
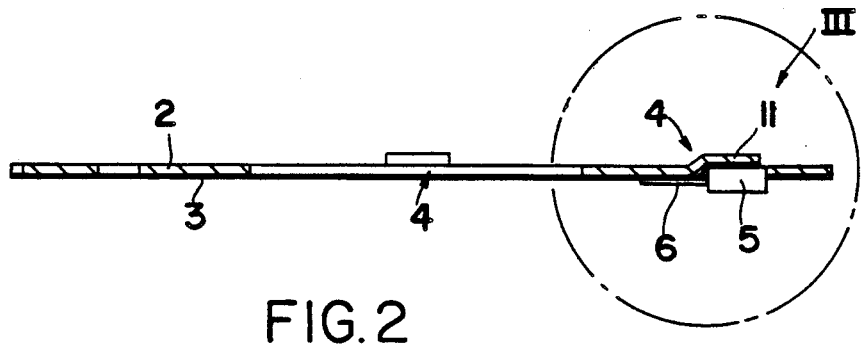
FIG. 2 is a sectional view taken along Line II—II of FIG. 1.

In FIGS. 1 and 2, a flat printed circuit board 1 is shown which consists of a metal layer 2 and of a printed circuit layer 3 which is mounted in a motor in a known manner. In this case, a thin insulating layer 3a is disposed between layers 2 and 3 and which, with the tracks of the printed circuit layer 3, forms a printed circuit board on an insulated metallic supporting layer.

Such printed circuit boards are also called metal PCB's. In the embodiment, the metal layer 2 consists of a low-retentivity iron plate and the mounted printed circuit layer 3 consists of copper with the mentioned insulating layer 3a being disposed underneath. FIG. 1 shows schematically the tracks 3', 3'', 3''' of the copper circuits which are normally visible on the surface, but are not drawn in detail here.

Other metals may also be used for the layer 2 which are suitable for deep-drawing. Applicant's invention relates to an improvement of the known flat PCB's with glued on electric components by creating a first pocket 41 which is impressed into the printed circuit board 1 for accommodating an electric component 5. The embodiment of FIGS. 1-4 show an electrical component 5 which is a Hall Integrated Circuit (Hall IC) with three leads 6 projecting out of one side of the component at the same level.

The recesses are accurately formed by an impression step on the metal PCB wherein edges 7 and 8 are accurately proscribed and a portion of the metal PCB is pressed downwardly and severed at the radial outward edge 7 to be folded downwardly as at 10 from the previous flat surface of the metal PCB.

Figure 3:
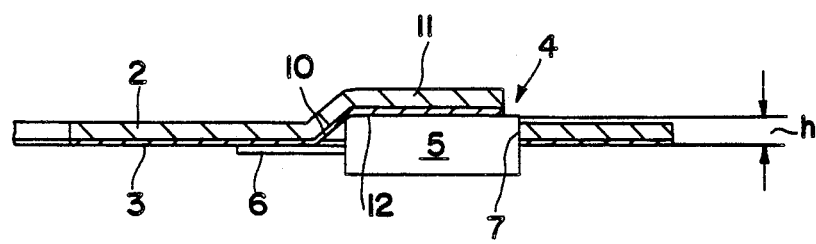
FIG. 3 is an enlarged detail of the electrical component shown at III in FIG. 2.

As shown in the enlarged representation of FIG. 3, the impressed depth of the recess is such that the leads 6 come to rest flat on the printed circuit layer 3 and thus can be soldered to it without any prior bending. In this case, electric component 5 is fixed so that it rests against the punched and severed edge 7 and, if required, against one of the cut or severed edges 8, 9, while the leads 6 are disposed over the rounded-off impressed edge 10. The pockets 41, 42 are all developed on one side of the metal PCB. The tab 11 is cut in a U-shape and is pressed out in one direction from the plane of the printed circuit board 1. Because of this tab 11, the resistance to a short-circuit because of insulation layer 3a remains effective (with low retentivity), whereby the sensitivity of the Hall IC (larger signal voltage) is improved in comparison to arranging the Hall IC merely in a fully opened hole in the PCB. The invention also improves the sensitivity in comparison to a Hall generator which is merely placed on a flat soft iron layer.

Figure 4:
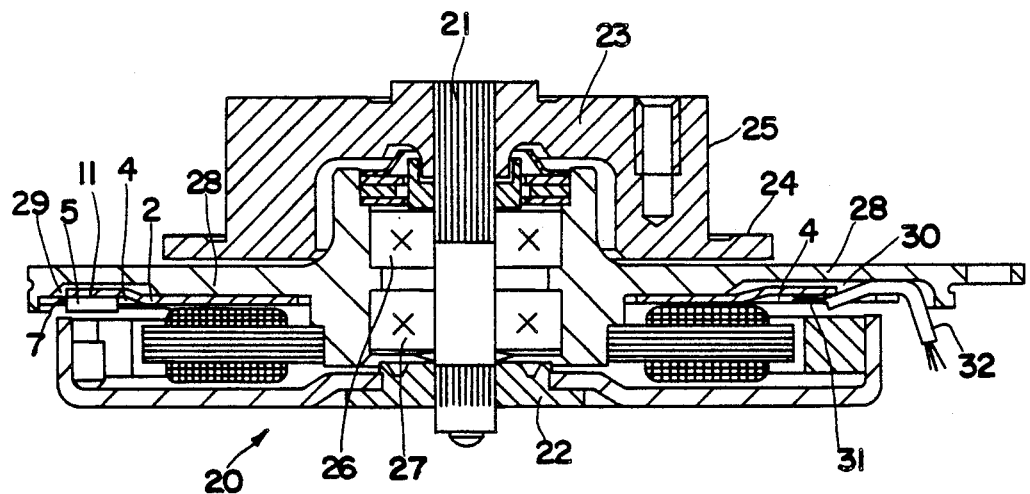
FIG. 4 is a sectional view of an electric motor with a printed circuit board according to the invention which is approximately twice the size of the actual motor.

FIG. 4 shows the use of the above-described printed circuit board 1 in an electric motor 20. This motor, which is constructed as a brushless direct-current motor, has a shaft 21 which is mounted by bearings 26, 27 to motor stator 28 and in an end area away from the motor end, is connected with a bell-shaped rotor 22 and at the other end drives a hub 23 which is non-rotatably fastened to the shaft 21. In the embodiment, the hub 23 is used for the drive of storage plates (not shown) which are used on computer disc drives. The low retentivity insulation layer 3a is used to protect against a magnetic short-circuit for magnetically sensitive components (Hall generator, Hall IC 5, etc.). The printed circuit board 1 (metal PCB) is also used as a shield against magnetic leakage flux.

FIG. 1 shows a second "empty" pocket 42, without any inserted component, radially further outside than pocket 41.

The Hall IC 5 in pocket 41 corresponds with the rotor magnet 51 (FIG. 4) for the so-called commutation control for the current of the electric motor 20. A four-pole rotor magnet 51 has four quarter shells, inserted into the rotor housing 53, with four rotor pole gaps.

In one rotor pole gap, the small signal magnet 54 is disposed which acts upon a signal generator 52 in the pocket 42 (see FIG. 4). The signal magnet 54 provides so-called index pulses, such as described in U.S. Pat. No. 4,379,984, for the operation of a hard-disk storage device.

For the latter purpose, the positions of elements 5, 52, particularly of generator 52, must be maintained very precisely and for a long period of time. Here the recess mounting is of special significance in maintaining the precise position and for a long period of time. U.S. Pat. No. 4,519,010 shows an alternative approach with the use of soft iron shielding rings in a flange for the same usage problems.

FIGS. 1 to 4 show the invention used in a so-called single-phase or two-phase collectorless direct-current motor, as described in DE-PS No. 2,346,380 or in U.S. Pat. No. 3,873,897.

If, for example, a three-phase collectorless direct-current motor is used, instead of one rotor position sensor 41, three sensors are required. These could be Hall generators with four electrical connectors or Hall-IC's 55, 56, 57 with three electrical connectors, for the commutation (switching) of the current pulses in the three groups of windings, as shown in FIG. 7.

In EP-OS No. 220,447, a metallic printed circuit board is shown, where components (Power transistors) are immersed into punched-out areas of the plate. This results in an extreme axial compactness. Each component hangs in the air in the punched-out areas.

According to the instant invention, the commutation elements, i.e., the Hall generators or Hall IC's, are positioned precisely in the ferromagnetic support (layer) of the printed insulated circuit board. In the case of three phases, the precision—the exact position with the respect to one another—is important. This means that the angular precision, in the case of three Hall-IC's 57, 55 56 (3-phase motor) must the precise with respect to the axis, and its radial position must also be precise.

Another known solution provides an electrical component, as a single device on a bent projection of a supporting flange which consists of aluminum. This low-retentivity printed circuit board carries a Hall element as the signal device. Here differences in thrust occur due to changes since the thermal coefficient of expansion between the iron shielding layer and the aluminum flange are different and this deteriously affects any precision location of the sensor. In this case, the Hall-IC is glued, in a complicated fashion, onto a bent projection of the aluminum flange plate.

According to the instant invention, the metallic printed circuit board with its short-circuit preventing characteristics is constructed as a punched tabular part in such a manner that recess windows are provided, which are punched out with corresponding precise measurements. These recess windows define stop faces 7 and 8 making for precise limit positions for the electrical components both radially 7 and angularly 8 with respect to the rotors without any high expenses when the components are assembled. These pockets or windows may also be located on bent tabs 77 inside or outside the circular area of the PCB's in order to accommodate electrical elements which are affected by the permanent magnets 75, 76 of the rotor (FIGS. 5,6, and 7) and where these elements are located internally of the air gap of the motor (FIG. 5) or externally of the motor (FIG. 6).

These tabs may also be provided, in a bent-away manner, at the outer edge (FIG. 6). Such a bent tab 88 may itself also have a U-shaped cutout 99 with a recessed pocket base 98 that is located in a precise manner to provide for simple adjusting possibilities for the positioning of signal generators (Hall signal IC's) with respect to cylindrical outer or inner surfaces of the rotor (FIGS. 5, 6).

The fact that a supporting part for all sensor elements and signal generators consists of a one piece support made of the same material (even of a punched bent part which is easy to make) in itself constitutes considerable progress in providing a monitoring for accurately and fixedly retaining the sensors and signal generators.

When the tabs with the pockets or windows are pressed out in parallel to the main plane of the PCB to form a recessed way (FIGS. 1-4); or are bent away at the edge (FIG. 6), or on the inside (FIG. 5), to project axially of the circuit board, a relatively high location precision is obtained in an inexpensive manner. The radii and angles in between recesses are maintained with high precision with respect to one another even when the temperatures changes and during long operating times.

Two applications for such electrical mounted components are:

(a) rotor positions sensors, which use, for example Hall elements, and which are intended for sensing the rotating permanent magnet of a brushless motor and which, in the case of a single-phase motor, one sensor 5 is arranged only on one side of the circumference of the circuit board or in the case of three-phase motors, three sensors are arranged, for example, at an angle of 120° with respect to one another. The angle chosen is that mechanical angle corresponding to the electrical angle between phases.

(b) so-called signal generators which, in hard-disk storage devices, have the purpose of extracting the rotor position as precisely as possible for the data access. This means that the signal generator (Hall IC) must be adjusted very precisely with respect to the circumference of the circuit board and its circumferential position must be precisely maintained. It must be possible to always extract the so-called O-position again and again.

These two types of applications—rotor position sensors and signal generators (in each case, as a Hall IC-)—operate with a magnetic field, which originates from the motor magnets of the rotor and from the much smaller motor signal magnets respectively and which, also rotate while being mounted on the rotor. Since, according to the motor construction, these two magnets are inevitably adjacent, the fields interfere with one another. Mainly, the field of the motor magnets interferes with the output signal of the Hall IC which should react to the small signal magnet at the rotor alone.

The deeper-located pocket area on which the Hall generator is placed while operating as the commutation signal generator or as an external signal generator, for these two magnetic fields which the Hall elements must each penetrate for the operation. This provides for a magnetic indication by a so-called magnetic short-circuit of the magnetic field, so that, in general, a desirable strengthening of the Hall signal may be assumed.

Because of the required, but, in a certain way, also undesirable proximity (of the magnets 51, 54) of the motor field, this motor field acts on the Hall signal generator 52 like a noise field. As a further development of the invention, it was found to be expedient to construct the recessed pocket base in a special manner so that it is used in a more targeted manner as a magnetic short-circuit. Here the motor leakage field in the signal circuit in the recessed pocket base (on which the signal generator is disposed) is attenuated by having the tab simply punched out, for example, in circular shape.

It should be observed that under such an arrangement a punchable burr remains at the edge. This limits the dimensioning of such a recess. The recess should be provided such that the magnetic circuit of the signal magnet 54 is close as possible to the circuit board, and that the magnetic circuit for the motor magnet, in the area of the holding tab for the signal magnet, is as weak as possible, because then the leakage field is relatively small.

An advantageous development of this recess was obtained by placing a hole of a relatively small diameter eccentrically, and not in the crossing point of the diagonal of the rectangular holding tab of the pocket. Thus, according to the invention, two extreme precision requirements are met in an inexpensive manner, such as:

(a) particularly in the case of a multiphase brushless direct-current motor, the rotor position sensors are provided corresponding to the number of phases, i.e. in a three-phase operation, three Hall IC's, are fixed in an exact position with respect to one another to last for a long time period. Also in the case of temperature this long term exact fixing with respect to one another is maintained; and (b) the so-called index drift due to sensor position changes is minimal (in the case of the multiphase motor, or also in the case of the single-phase motor) because the Hall IC, for the external generating of signals for operating a hard-disk storage device, maintains its precise position for a long time despite fluctuating temperatures, so that repeated access is secured to the old rotational zero position for the future extraction of data when the motor is used to drive a computer disc.

The height of the motor utilizing this invention can also be reduced by providing cut-outs 29 in the stator housing 28 adjacent the recess in the PCB to enclose the tab 11 after it is been severed and bent. A corresponding cut-out 30 in the stator housing 28 can be used to receive power line 32 which can be soldered to the printed circuit board. The slit at edge 7 or 8 can be made larger to allow the line 32 to be wrapped around the end of the PCB to provide additional strength and protection for the joint 31.

Although the present invention has been described and illustrated in detail, it is to be clearly understood that the same is by way of illustration and example only, and is not to be taken by way of limitation. The spirit and scope of the present invention are to be limited only by the terms of the appended claims.

We claim:

1. A printed circuit board having a metallic layer supporting body on which a flat insulating layer is provided, a layer with individual metallic tracks being provided on this insulating layer for the connection of electric components, wherein there is at least one depression impressed into the printed circuit board for accommodating at least one of the electric components, and wherein the depression is constructed as a pocket by cutting a tab which is essentially U-shaped and pressing it out in one direction from the plane of the printed circuit board.

2. A printed circuit board according to claim 1, wherein at least one portion of a base surface of the depression extends in a plane parallel to a surface of the printed circuit board.

3. A printed circuit board according to claim 2, wherein the pocket is defined essentially by three cutting edges and by the pressed-out tab.

4. A printed circuit board according to claim 2, wherein the electrical components are for the operation of an electric motor, and wherein the depression has side walls that project into recesses of an electric motor flange.

5. A printed circuit board according to claim 1, wherein the pocket is defined essentially by three cutting edges and by the pressed-out tab.

6. A printed circuit board according to claim 5, wherein the electrical components are for the operation of an electric motor, and wherein the depression has side walls that project into recesses of an electric motor flange.

7. A printed circuit board according to claim 5, wherein the printed circuit board has several pockets and a first pocket contains a rotor position detector.

8. A printed circuit board according to claim 1, wherein the electrical components are for the operation of an electric motor, and wherein the depression has side walls that project into recesses of an electric motor flange.

9. A printed circuit board having a metallic layer supporting body on which a flat insulating layer is provided, a layer with individual metallic tracks being provided on this insulating layer for the connection of electric components, wherein there is at least one depression impressed into the printed circuit board for accommodating at least one of the electric components, wherein at least one portion of a base surface of the depression extends in a plane parallel to a surface of the printed circuit board, and wherein the depression defines a pocket created essentially by three cutting edges and by a pressed-out tab.

10. A printed circuit board according to claim 9, wherein the metallic layer has low retentivity and also carries at least one magnetic field sensitive component.

11. A printed circuit board, having a metallic layer supporting body on which a flat insulating layer is provided, a layer with individual metallic tracks being provided on this insulating layer for the connection of electric components, wherein there is at least one depression impressed into the printed circuit board for accommodating at least one of the electric components, wherein the electrical components are for the operation of an electric motor, and wherein the depression has side walls that project into recesses of an electric motor flange.

12. A printed circuit board according to claim 11, wherein the metallic layer has low retentivity and also carries at least one magnetic field sensitive component and wherein the depression is constructed by a tab.

13. A printed circuit board according to claim 12, wherein the printed circuit board acts as a shield against leakage flux.

14. A printed circuit board according to claim 13, wherein the tab has at least one of a passage opening and profiled shortened end at one of its edges.

15. A printed circuit board according to claim 12, wherein the tab has at least one of a passage opening and profiled shortened end at one of its edges.

16. A printed circuit board having a metallic layer supporting body on which a flat insulating layer is provided, a layer with individual metallic tracks being provided on this insulating layer for the connection of electric components, wherein there is at least one depression impressed into the printed circuit board for accommodating at least one of the electric components, wherein at least one portion of a base surface of the depression extends in a plane parallel to a surface of the printed circuit board, wherein the electrical components are for the operation of an electric motor, and wherein the depression has side walls that project into recesses of an electric motor flange.

17. A printed circuit board having a metallic layer supporting body on which a flat insulating layer is provided, a layer with individual metallic tracks being provided on this insulating layer for the connection of electric components, wherein there is at least one depression impressed into the printed circuit board for accommodating at least one of the electric components, wherein the printed circuit board has several pockets and a first pocket contains a rotor position detector, and wherein another pocket has a magnetic pulse signal generator which is positioned adjacent a rotor opposite a signal magnet.

18. A printed circuit board having a metallic layer supporting body on which a flat insulating layer is provided, a layer with individual metallic tracks being provided on this insulating layer for the connection of electric components, wherein there is at least one depression impressed into the printed circuit board for accommodating at least one of the electric components, and wherein at least one depression contains electrical connecting ends and an electric lead.

19. A printed circuit board having a metallic layer supporting body on which a flat insulating layer is provided, a layer with individual metallic tracks being provided on this insulating layer for the connection of electric components, wherein there is at least one depression impressed into the printed circuit board for accommodating at least one of the electric components, wherein the printed circuit board has several pockets and a first pocket contains a rotor position detector, and wherein several sensors are provided equidistantly on the printed circuit board for a coaxial circuit of a multiphase motor.

* * * * *